(12) United States Patent
Wong et al.

(10) Patent No.: US 7,880,296 B2
(45) Date of Patent: Feb. 1, 2011

(54) CHIP CARRIER STRUCTURE HAVING SEMICONDUCTOR CHIP EMBEDDED THEREIN AND METAL LAYER FORMED THEREON

(75) Inventors: Lin-Yin Wong, Hsin-Chu (TW); Zao-Kuo Lai, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 12/044,271

(22) Filed: Mar. 7, 2008

(65) Prior Publication Data

US 2008/0217762 A1    Sep. 11, 2008

(51) Int. Cl.
*H01L 23/12* (2006.01)
*H01L 23/053* (2006.01)

(52) U.S. Cl. ............... 257/700; 257/678; 257/684; 257/686; 257/707; 257/690; 438/106; 438/109; 438/121; 438/124

(58) Field of Classification Search .......... 257/700, 257/773, 737, 738, 685, 687, 635, 686, 723, 257/777, 778, E23.01, E21.502, 706, 707, 257/678, 684, 690, 679, 699; 438/106, 107, 438/108, 109, 121, 124, 127
See application file for complete search history.

(56) References Cited

U.S. PATENT DOCUMENTS 5,776,797 A * 7/1998 Nicewarner et al. ......... 438/107
6,154,366 A   11/2000 Ma et al.
7,396,700 B2 * 7/2008 Hsu ............................ 438/107
7,449,363 B2 * 11/2008 Hsu ............................ 438/106
2005/0048759 A1 * 3/2005 Hsu ............................ 438/618
2005/0189635 A1 * 9/2005 Humpston et al. .......... 257/678
2006/0087037 A1 * 4/2006 Hsu ............................ 257/738
2006/0115931 A1 * 6/2006 Hsu ............................ 438/121
2007/0200133 A1 * 8/2007 Hashimoto et al. .......... 257/100
2008/0006936 A1 * 1/2008 Hsu ............................ 257/731
2008/0029895 A1 * 2/2008 Hu et al. ..................... 257/762
2008/0067666 A1 * 3/2008 Hsu ............................ 257/700
2008/0128865 A1 * 6/2008 Chia ........................... 257/620

* cited by examiner

*Primary Examiner*—Thao X Le
*Assistant Examiner*—Thanh Y Tran
(74) *Attorney, Agent, or Firm*—Schmeiser, Olsen & Watts LLP (57) ABSTRACT

The present invention provides a chip carrier structure having a semiconductor chip embedded therein and a protective metal layer formed thereon and a fabrication method thereof. The chip carrier structure includes a chip-embedded carrier structure, and a metal layer formed by electroplating on the bottom surface and side surfaces of the chip-embedded carrier structure. The metal layer prevents moisture from crossing the side surfaces of the chip-embedded carrier structure, so as to prevent delamination, provide a shielding effect, and improve heat dissipation through the metal layer.

12 Claims, 7 Drawing Sheets

CHIP CARRIER STRUCTURE HAVING SEMICONDUCTOR CHIP EMBEDDED THEREIN AND METAL LAYER FORMED THEREON

FIELD OF THE INVENTION

The present invention relates to a carrier structure, and more particularly, to a chip carrier structure having a semiconductor chip embedded therein and a protective metal layer formed thereon.

BACKGROUND OF THE INVENTION

As electronic industry evolves rapidly, electronic products having small form factors are desired. Better performance, better functionality and higher speed are of interest. In order to meet requirements such as high integration and miniaturization of the semiconductor devices, circuit boards that provide a plurality of active/passive components and circuits have evolved from double layers to multi-layers, in order to expand the available circuit layouts on the circuit boards through interlayer connection under confined spaces.

In the industry of carrier board manufacturing, low cost, high reliability and high routing density have always been the objectives. In order to achieve these objectives, a technique called "build up" technique has been developed, which essentially stacks a plurality of dielectric layers and circuit layers on one another and forms conductive structures such as blind vias or plated through holes for electrically connecting the various circuit layers.

In addition, along with the rapid growth of various portable devices, packaging techniques such as BGA, flip-chip, CSP (chip-size packaging) and MCM (multi-chip module) and even carrier structures embedded with semiconductor elements are becoming the mainstream of the semiconductor market.

Figure 1A:
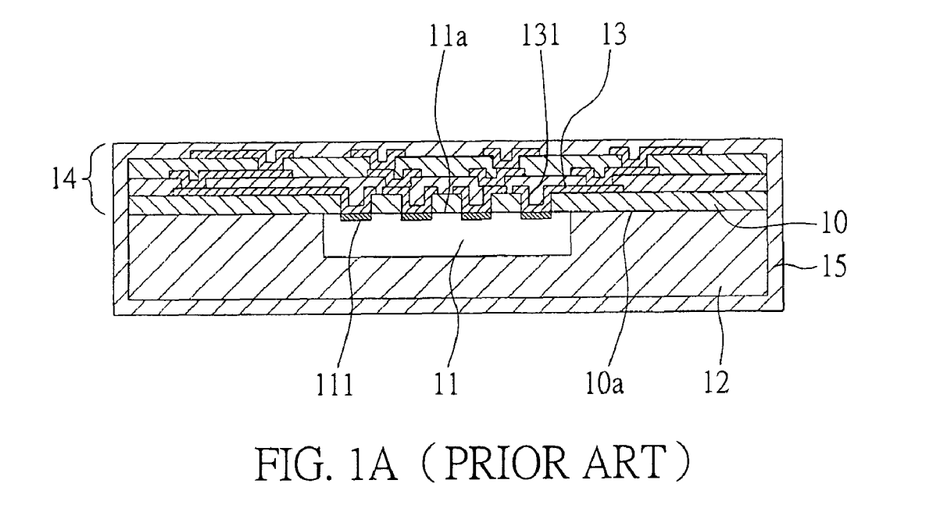
FIGS. 1A and 1B are cross-sectional views illustrating the method for fabricating a prior-art core carrier board.

Referring now to FIG. 1A, U.S. Pat. No. 6,154,366 titled "Structures and Processes for Fabricating Moisture Resistant Chip-on-Flex Packages" is illustrated. As shown, a lower surface 10a of the flex component 10 is attached to a microelectronic die 11 having an active surface 11a with contacts 111. An encapsulating material 12 is formed on the lower surface 10a of the flex component 11 and the exposed surfaces of the microelectronic die 11. A conductive circuit layer 13 is formed on the flex component 10. Blind vias 131 is formed in the flex component 13 to electrically connect the contacts 11 of the microelectronic die 11. Similar elements may be used to form additional circuit build up structures 14. A moisture barrier 15 is formed on the top surface of the circuit build up structure 14, the side surfaces of the circuit build up structure 14 and the encapsulating material 12 and the bottom surface of the encapsulating material 12 to prevent the circuit layers 13 in the circuit build up structure 14 from moisture.

The moisture barrier 15 may include: sol-gel oxides (e.g. tungsten oxide) formed by the sol-gel technique; PCTFE (polychloro-trifluoro-ethylene) or high-density organic coatings (e.g. photoresist) formed by coating; and metal oxides formed by metal deposition followed by thermal oxidation. Considering the effect of oxidation, which has a thickness from 0.1 to 1μ, the material is preferably titanium having a fully oxidized temperature of 200° C.

Although the moisture barrier 15 in this case fully covers the encapsulating material 12 and the circuit build up structure 14, but the morphology of the moisture barrier formed by sol-gel or coating is rather loose, as a result, moisture may still permeate into the various structural layers. Whereas the moisture barrier 15 formed using thermal oxidation is not only process-complicated but the materials available for selection as well as its thickness are rather limited.

Figure 1B:
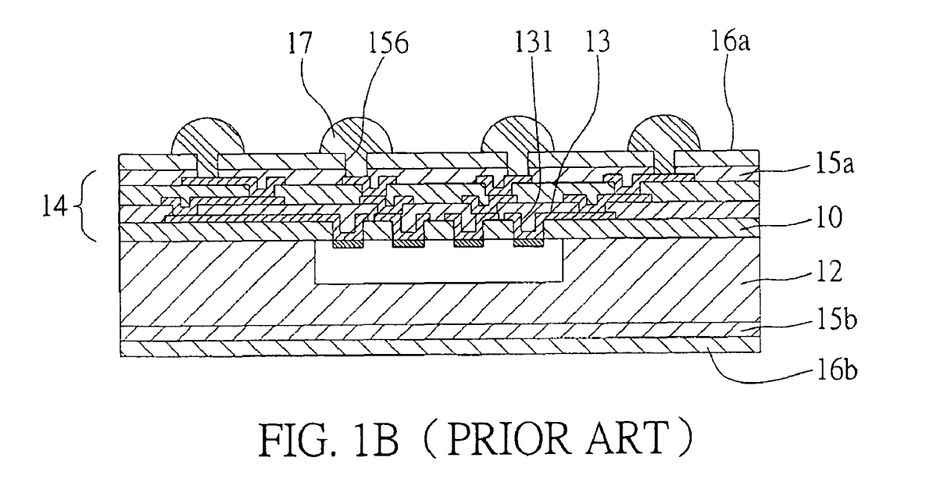

Referring to FIG. 1B, a complete final product of an alternative of the aforementioned structure is shown, wherein a first moisture barrier 15a is formed on the top surface of the circuit build up structure 14, and a second moisture barrier 15b is formed on the bottom surface of the encapsulating material 12. First and second solder mask layers 16a and 16b are formed on the first and second moisture barriers 15a and 15b respectively. Deep vias 156 are formed in the first moisture barrier 15a and the first solder mask layer 16a to expose the electrically connecting pads in the circuit build up structure 14, so as to form conductive structures 17 in the deep vias 156.

The first and second moisture barriers 15a and 15b are only formed on the top surface of the circuit build up structure 14 and the bottom surface of the encapsulating material 12, the side surfaces of the encapsulating material 12 and the circuit build up structure 14 are not protected. As a result, moisture, oil and contaminations may easily enter between the encapsulating material 12 and the circuit build up structure 14 and travel to the junction of the various circuits in the circuit build up structure 14, causing delamination or even oxidation or erosion of the circuits.

Furthermore, since the microelectronic die 11 is embedded into the encapsulating material 12, the electrical performance of the microelectronic die 11 completely rely on the circuit layer 13 on the top surface of the flex component 10 and the build up structure 14, and hence are limited. Moreover, the encapsulating material 12 occupies precious space but has no electrical performance at all.

In addition, the microelectronic die 11 is completely embedded in the encapsulating material 12 and covered by the flex component 10, the circuit layer 13 and the circuit build up structure 14, heat cannot be easily dissipated outside, which may cause deleterious effect during high-speed operations.

Therefore, there is a need to provide a chip carrier structure to prevent moisture from intruding into the chip carrier structure and causing delamination as is the case in the prior art, as well as to improve heat dissipation and space utilization.

SUMMARY OF THE INVENTION

In the light of foregoing drawbacks, an objective of the present invention is to provide a chip carrier structure having a semiconductor chip embedded therein and a protective metal layer formed thereon to prevent moisture from intruding into the chip carrier structure, thereby avoiding oxidation and erosion of the circuits within the chip carrier structure.

Another objective of the present invention is to provide a chip carrier structure having a semiconductor chip embedded therein and a protective metal layer formed thereon, to improve utilization of space and increase electrical performance.

Still another objective of the present invention is to provide a chip carrier structure having a semiconductor chip embedded therein and a protective metal layer formed thereon to facilitate heat dissipation of the embedded semiconductor chip.

In accordance with the above and other objectives, the present invention provides a chip carrier structure having a semiconductor chip embedded therein and a protective metal layer formed thereon, which includes: a chip carrier with a semiconductor chip embedded therein; and a metal layer electroplated on the bottom surface and side surfaces of the chip carrier.

The metal layer can be made of one selected from the group consisting of copper, gold, nickel, palladium, silver, tin, nickel/palladium, chromium/titanium, nickel/gold, palladium/gold, and nickel/palladium/gold.

The chip carrier structure of the present invention may further include a conductive layer formed between the chip carrier and the metal layer. The conductive layer can be made of one selected from the group consisting of copper, tin, nickel, chromium, titanium, and copper-chromium alloy. Alternatively, the conductive layer may also be made of a conductive polymer.

The chip carrier with an embedded semiconductor chip includes: a carrier board having a first surface, a second surface and at least one openings penetrating the first and second surfaces; a semiconductor chip having an active surface with electrode pads and an inactive surface provided in the opening of the carrier board; a circuit build up structure formed on the first surface of the carrier board and the active surface of the semiconductor chip, including at least one conductive structures for electrically connecting to the electrode pads of the semiconductor chip, and having a plurality of electrically connecting pads on the surface of the circuit build up structure; and a solder mask layer formed on the circuit build up structure having openings to expose the electrically connecting pads.

The inactive surface of the semiconductor chip may be in contact with the conductive layer and the metal layer, so that heat dissipation may occur through the metal layer. Moreover, an opening can be formed in the conductive layer and the metal layers to expose the inactive surface of the semiconductor chip to further enhance heat dissipation.

The carrier board may be a circuit board, an insulated board, or a metal board. The metal layer can be made of one selected from the group consisting of copper, gold, nickel, palladium, silver, tin, nickel/palladium, chromium/titanium, nickel/gold, palladium/gold, and nickel/palladium/gold. The conductive layer can be made of one selected from the group consisting of copper, tin, nickel, chromium, titanium, and copper-chromium alloy. Alternatively, the conductive layer may also be made of a conductive polymer.

An opening may be further formed in the metal layer and the conductive layer to expose the inactive surface of the semiconductor chip for heat dissipation.

In summary, the chip carrier structure having a semiconductor chip embedded therein and a protective metal layer formed thereon of the present invention essentially comprises forming a conductive layer on the side surfaces and bottom surface of the chip carrier, and thus forming a metal layer on the conductive layer by electroplating. This allows a morphologically dense protective metal layer to be formed using known electroplating techniques, preventing moisture from permeating into the chip carrier structure, and hence avoiding delamination and oxidation or erosion of the circuit layer as well as the semiconductor chip. In addition, the metal layer on the side surfaces and bottom surface of the chip carrier shields the chip carrier from electromagnetic interference and improve heat dissipation of the embedded semiconductor chip. Further, the carrier board of the chip carrier is a circuit board with circuits thereon, thereby increasing electrical performance. Moreover, an opening can further be formed in the metal layer on the bottom surface of the chip carrier to expose the inactive surface of the semiconductor chip in order to increase heat dissipation of the semiconductor chip.

BRIEF DESCRIPTION OF THE DRAWINGS

The present invention can be more fully understood by reading the following detailed description of the preferred embodiments, with reference made to the accompanying drawings, wherein:

FIG. 2E' is a bottom view of FIG. 2E; and

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

First Embodiment

Referring to FIGS. 2A to 2H, cross-sectional schematic views of a chip carrier structure having a semiconductor chip embedded therein and a protective metal layer formed thereon according to the first embodiment of the present invention are shown.

Figure 2A:
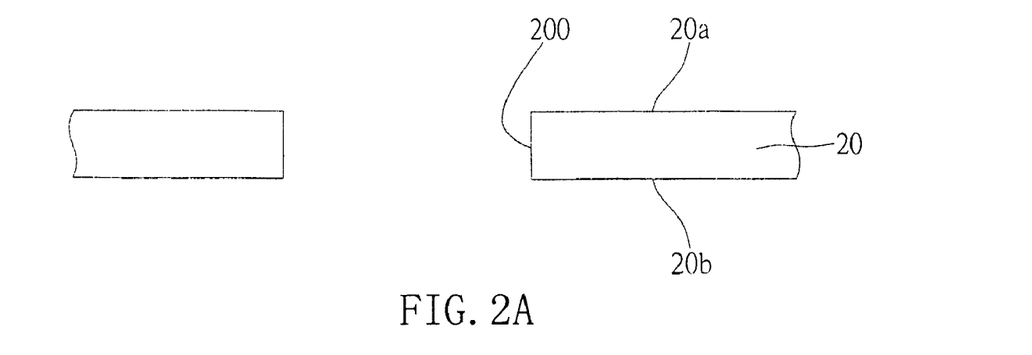
FIGS. 2A to 2H are cross-sectional schematic views of a chip carrier structure having a semiconductor chip embedded therein and a protective metal layer formed thereon according to the first embodiment of the present invention.

In FIG. 2A, a carrier board 20 having a first surface 20a and a second surface 20b is first provided. The carrier board 20 has at least one opening 200 penetrating the first and second surfaces 20a and 20b. The carrier board 20 can, for example, be one of a circuit board, insulated board and metal board.

Figure 2B:
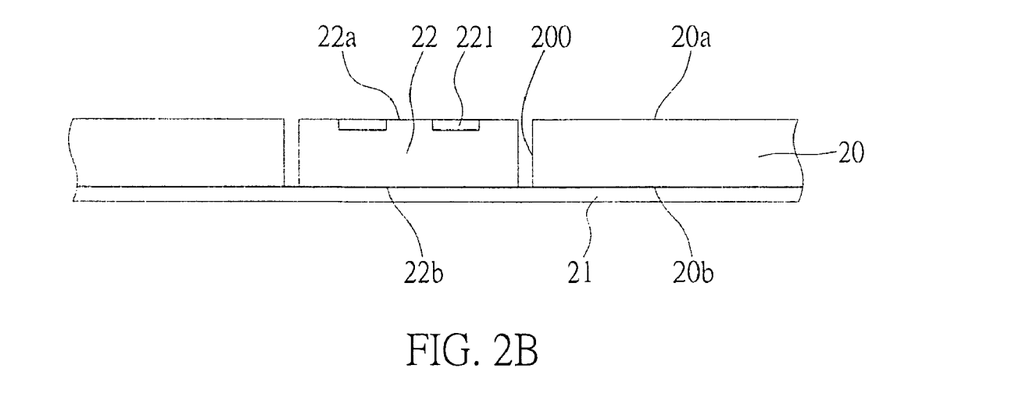

Referring to FIG. 2B, a release film 21 is formed on the second surface 20b of the carrier board 20 to seal one end of the opening 200. A semiconductor chip 22 is then attached on the release film 21 within the opening 200. The semiconductor chip 22 has an active surface 22a formed with a plurality of electrode pads 221 and an inactive surface 22b.

Figure 2C:
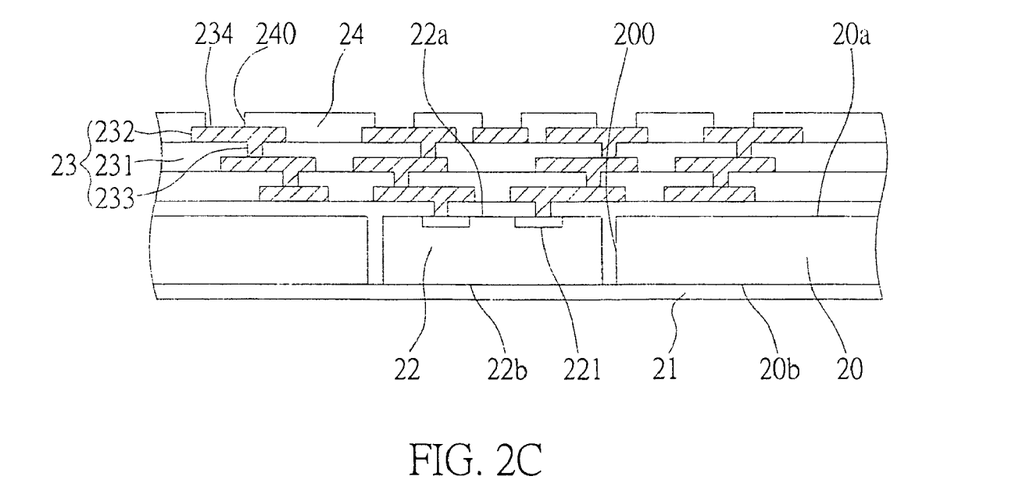

Referring to FIG. 2C, a circuit build up structure 23 is formed on the first surface 20a of the carrier board 20 and the active surface 22a of the semiconductor chip 22. The method for fabricating a circuit build up structure 23 is well-known in the art and thus will not be discussed any further. The circuit build up structure 23 includes a dielectric layer 231, a circuit layer 232 formed on the dielectric layer 231 and a conductive structure 233 formed in the dielectric layer 231. A portion of the conductive structure 233 in the circuit build up structure is electrically connected to the electrode pads 221 of the semiconductor chip 22. The circuit build up structure 23 has a plurality of electrically connecting pads 234. A solder mask layer 24 is further formed on the circuit build up structure 23 having openings 240 formed therein to expose the electrically connecting pads 234.

Figure 2D:
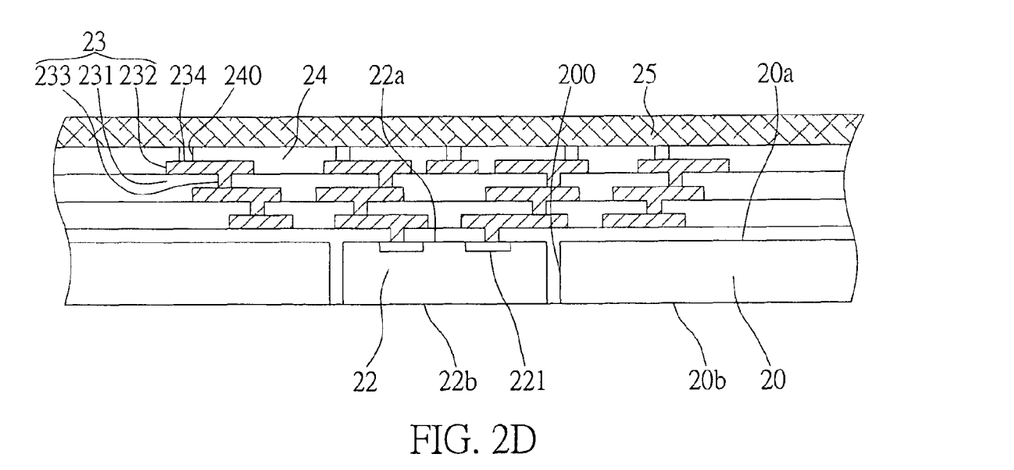

Referring to FIG. 2D, a release board 25 is formed on the surface of the solder mask layer 24 and the release film 21 is removed.

Figure 2E:
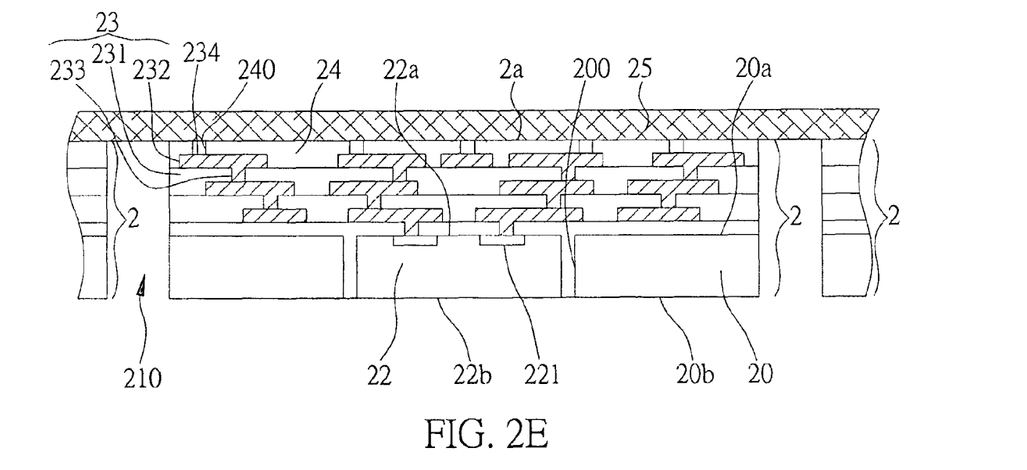

Referring to FIGS. 2E and 2E', a singulation process is performed that forms a plurality of grooves 210 in the carrier board 20 without penetrating the release board 25, so as to form a plurality of chip carriers 2 each having a semiconductor chip embedded therein.

Figure 2F:
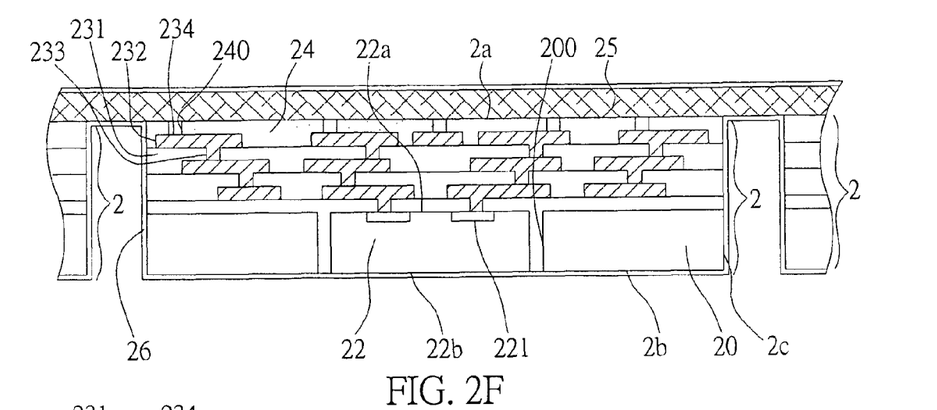

Referring to FIG. 2F, a conductive layer 26 is formed on the outer surface of the chip carrier 2, and more particularly on the surfaces of the release board 25 and the grooves 210, by chemical deposition such as electroless plating or physical vapor deposition such as sputtering. That is, except the top surface 2a of the chip carrier 2, the exposed bottom surface 2b and side surfaces 2c of the chip carrier 2 and the outer surface of the release board 25 are all formed with the conductive layer 26. The conductive layer 26 can be made of one selected from the group consisting of copper, tin, nickel, chromium, titanium, and copper-chromium alloy. Moreover, the conductive layer 26 can also be made of a polymer by printing or coating. In this embodiment, copper is used as the electrical current conduction path for those subsequently electroplated circuits.

Figure 2G:
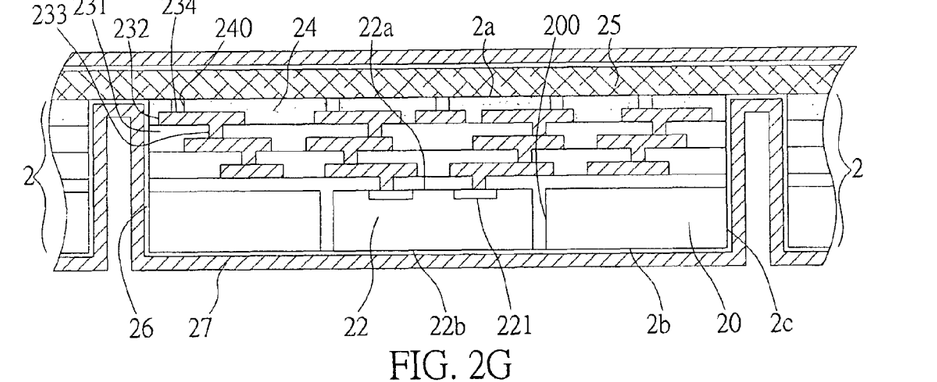

Referring to FIG. 2G, an electroplating process is performed to form a metal layer 27 on the surface of the conductive layer 26, which serves as the electrical current conduction path. The metal layer 27 is made of one selected from the group consisting of copper, gold, nickel, palladium, silver, tin, nickel/palladium, chromium/titanium, nickel/gold, palladium/gold, and nickel/palladium/gold.

Figure 2H:
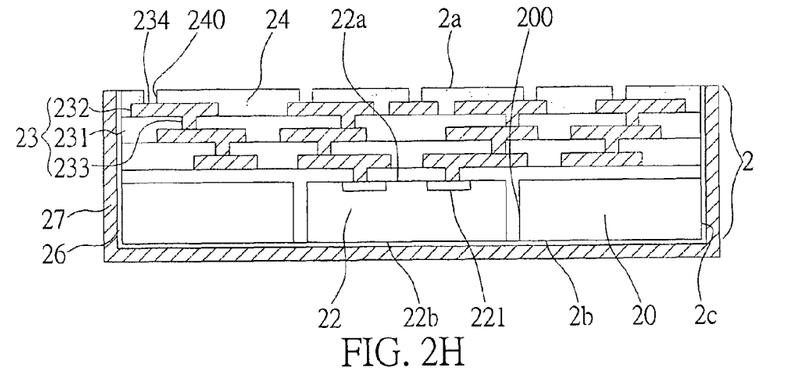

Referring to FIG. 2H, the release board 25 as well as both the conductive layer 26 and the metal layer 27 on the release board 25 are removed. Also, a residual portion of the conductive layer 26 and metal layer 27 between the chip carriers 2 is removed, thereby forming a plurality of chip carriers 2 having the protective metal layer 27 formed on the bottom surface 2b and the side surfaces 2c of the chip carriers 2.

Since the metal layer 27 fully covers the bottom surface 2b and the side surfaces 2c of the chip carrier 2, moisture is prevented from intruding into the chip carrier 2, and delamination is avoided. This prevents the circuit layer 232 and the semiconductor chip 22 in the chip carrier 2 from oxidation and erosion in the presence of moisture. In addition, the metal layer formed on the bottom surface 2b and the side surfaces 2c of the chip carrier 2 has a shielding effect for electromagnetic interference. Moreover, the inactive surface 22b of the semiconductor chip 22 is in contact with the conductive layer 26 and the metal layer 27, heat dissipation of the semiconductor chip 22 takes places through the metal layer 27.

The present invention further proposes a chip carrier structure having a semiconductor chip embedded therein and a protective metal layer formed thereon, the chip carrier structure includes: a chip carrier 2 embedded with a semiconductor chip and a metal layer 27 electroplated on the bottom surface 2b and the side surfaces 2c of the chip carrier 2.

The chip carrier 2 includes: a carrier board 20 having a first surface 20a and a second surface 20b and at least one opening 200 penetrating the first and second surfaces 20a and 20b, the carrier board 20 being a circuit board, insulated board or metal board; a semiconductor chip 22 having an active surface 22a and an inactive surface 22b provided in the opening 200 of the carrier board 20, the active surface 22a having electrode pads 221; a circuit build up structure 23 formed on the first surface 20a of the carrier board 20 and the active surface 22a of the semiconductor chip 22, the circuit build up structure 23 including a dielectric layer 231, a circuit layer 232 formed on the dielectric layer 231 and a conductive structure 233 formed in the dielectric layer 231, wherein a portion of the conductive structure 233 is electrically connected to the electrode pads 221 of the semiconductor chip 22, and the circuit build up structure 23 has a plurality of electrically connecting pads 234 thereon; and a solder mask layer 24 formed on the circuit build up structure 23 having openings 240 to expose the electrically connecting pads 234.

A conductive layer 26 is formed between the chip carrier 2 and the metal layer 27 and is made of one selected from the group consisting of copper, tin, nickel, chromium, titanium, copper-chromium alloy, and a conductive polymer. The metal layer 27 is made of one selected from the group consisting of copper, gold, nickel, palladium, silver, tin, nickel/palladium, chromium/titanium, nickel/gold, palladium/gold, and nickel/palladium/gold.

An opening 267 is further formed in the metal layer 27 and the conductive layer 26 to expose the inactive surface 22b of the semiconductor chip 22.

Second Embodiment

Figure 3A:
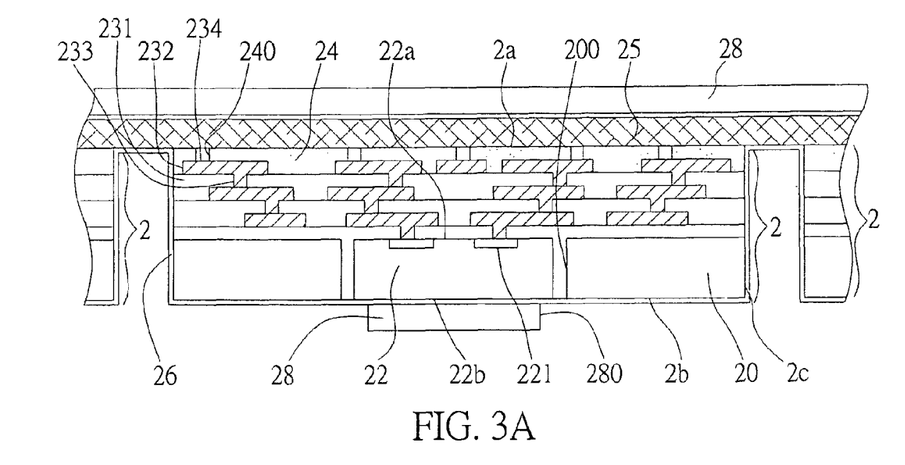
FIG. 3A to FIG. 3C are cross-sectional schematic views of a chip carrier structure having a semiconductor chip embedded therein and a protective metal layer formed thereon according to the second embodiment of the present invention.
Figure 3B:
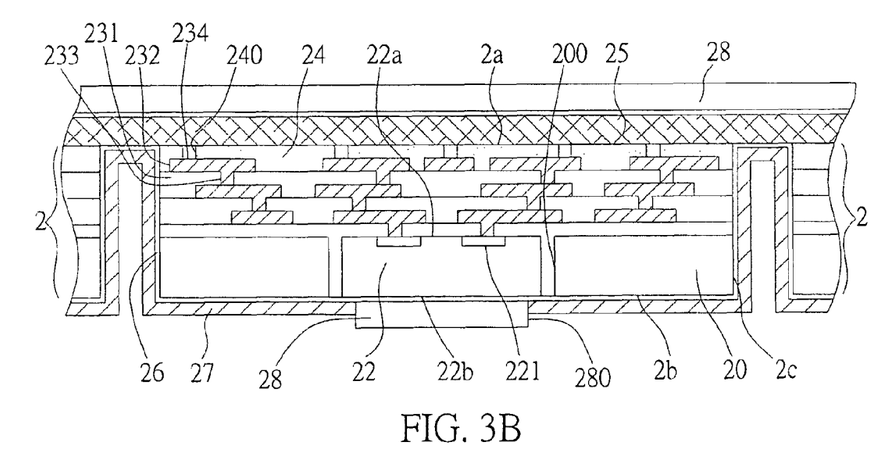
Figure 3C:
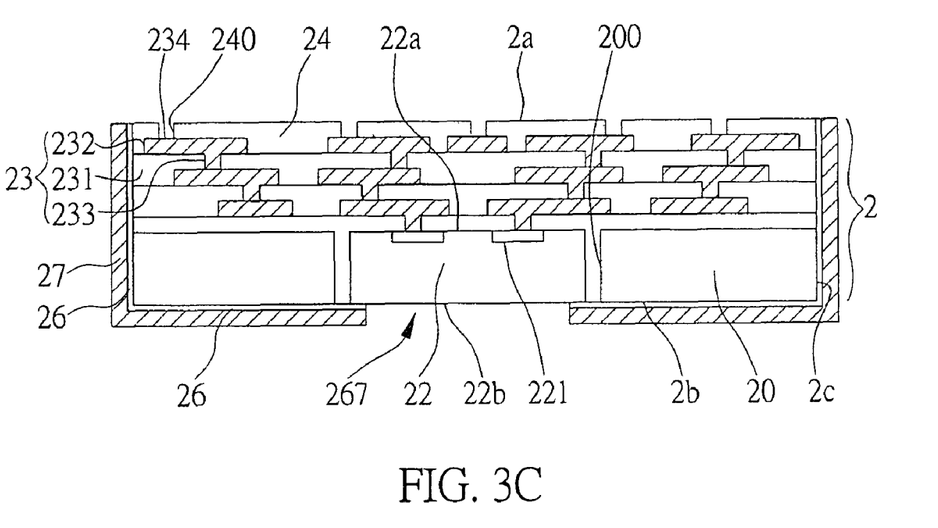

Referring to FIGS. 3A to 3C, which illustrate the second embodiment of the present invention. The second embodiment is different from the first embodiment in that an opening 267 is further formed in the metal layer 27 and the conductive layer 26 at the bottom of the chip carrier 2 embedded with a semiconductor chip, to expose the inactive surface 22b of the semiconductor chip 22, and facilitate heat dissipation by directly exposing the inactive surface 22b.

Referring to FIG. 3A, a structure shown in FIG. 2F is provided. A resist layer 28 is formed on the surface of the conductive layer 26. Resist openings 280 are formed in the resist layer 28 to expose the bottom surface 2b and the side surfaces 2c of the chip carrier 2 but cover the inactive surface 22b of the semiconductor chip 22.

As shown in FIG. 3B, an electroplating process is performed to form a metal layer 27 on the surface of the conductive layer 26 that is within the resist opening 280.

As shown in FIG. 3C, the release board 25, the conductive layer 26 and the metal layer 27 on the top surface 2a of the chip carrier 2 and a residual portion of the conductive layer 26 and the metal layer 27 between the chip carriers 2 are removed. Also, the resist layer 28 on the bottom surface 2b of the chip carrier 2 is removed, forming a plurality of chip carriers 2 each having the protective metal layer 27 formed on the side surfaces 2c, the bottom surface 2b, an opening 267 in the metal layer 27, and the conductive layer 26 to directly expose the inactive surface 22b of the semiconductor chip 22 for heat dissipation.

In summary, the chip carrier structure having a semiconductor chip embedded therein and a protective metal layer formed thereon of the present invention primarily forms a conductive layer on the side surfaces and bottom surface of the chip carrier, and thus forming a metal layer on the conductive layer by electroplating. This allows a morphologically dense protective metal layer to be formed using known electroplating techniques, preventing moisture from permeating into the chip carrier structure, thus avoiding delamination, oxidation, and erosion of the circuit layer and the semiconductor chip. In addition, the metal layer on the side surfaces and bottom surface of the chip carrier shields the chip carrier from electromagnetic interference and speeds up heat dissipation of the embedded semiconductor chip. Further, the carrier board in the chip carrier is a circuit board with circuits thereon, thereby enhancing electrical performance. Moreover, an opening can further be formed in the metal layer on the bottom surface of the chip carrier to expose the inactive surface of the semiconductor chip in order to increase heat dissipation of the embedded semiconductor chip.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:

1. A chip carrier structure having a semiconductor chip embedded therein and a protective metal layer formed thereon, comprising:
   a chip carrier including a carrier board having a first surface, a second surface and at least one opening penetrating the first and second surfaces, the semiconductor chip having an active surface with electrode pads and an inactive surface provided in the opening of the carrier board, a circuit build up structure formed on the first surface of the carrier board and the active surface of the semiconductor chip, comprising at least one conductive via for electrically connecting to the electrode pads of the semiconductor chip, and having a plurality of electrically connecting pads on a surface of the circuit build up structure, and a solder mask layer formed on the circuit build up structure having openings to expose the electrically connecting pads;
   a conductive layer formed on a bottom surface and side surfaces of the chip carrier and the inactive surface of the semiconductor chip wherein part of the inactive surface of the semiconductor chip is exposed from the conductive layer; and
   an electroplating metal layer electroplated on the conductive layer, the electroplating metal layer formed above the bottom surface and side surfaces of the chip carrier and the inactive surface of the semiconductor chip, and the conductive layer and the electroplating metal layer not connecting to the active surface and the electrode pads of the semiconductor chip.

2. The chip carrier structure of claim 1, wherein the conductive layer is made of one selected from the group consisting of copper, tin, nickel, chromium, titanium, and copper-chromium alloy.

3. The chip carrier structure of claim 1, wherein the conductive layer is made of a conductive polymer.

4. The chip carrier structure of claim 1, wherein the electroplating metal layer is one selected from the group consisting of copper, gold, nickel, palladium, silver, tin, nickel/palladium, chromium/titanium, nickel/gold, palladium/gold, and nickel/palladium/gold.

5. The chip carrier structure of claim 1, wherein the carrier board is one selected from the group consisting of a circuit board, an insulated board, and a metal board.

6. The chip carrier structure of claim 1, wherein the circuit build up structure comprises at least one dielectric layer, at least one circuit layer formed on the dielectric layer and the conductive via formed in the dielectric layer.

7. A chip carrier structure having a semiconductor chip embedded therein and a protective metal layer formed thereon, comprising:
   a chip carrier including a carrier board having a first surface, a second surface and at least one opening penetrating the first and second surfaces, the semiconductor chip having an active surface with electrode pads and an inactive surface provided in the opening of the carrier board, a circuit build up structure formed on the first surface of the carrier board and the active surface of the semiconductor chip, comprising at least one conductive via for electrically connecting to the electrode pads of the semiconductor chip, and having a plurality of electrically connecting pads on the surface of the circuit build up structure, and a solder mask layer formed on the circuit build up structure having openings to expose the electrically connecting pads;
   a conductive layer formed on a bottom surface and side surfaces of the chip carrier and an edge of the inactive surface of the semiconductor chip, wherein part of the inactive surface of the semiconductor chip is exposed from the conductive layer; and
   an electroplating metal layer electroplated on the conductive layer, the electroplating metal layer formed above the bottom surface and side surfaces of the chip carrier and the edge of the inactive surface of the semiconductor chip to expose part of the inactive surface of the semiconductor chip, and the conductive layer and the electroplating metal layer not connecting to the active surface and the electrode pads of the semiconductor chip.

8. The chip carrier structure of claim 7, wherein the conductive layer is made of one selected from the group consisting of copper, tin, nickel, chromium, titanium, and copper-chromium alloy.

9. The chip carrier structure of claim 7, wherein the conductive layer is made of a conductive polymer.

10. The chip carrier structure of claim 7, wherein the electroplating metal layer is one selected from the group consisting of copper, gold, nickel, palladium, silver, tin, nickel/palladium, chromium/titanium, nickel/gold, palladium/gold, and nickel/palladium/gold.

11. The chip carrier structure of claim 7, wherein the carrier board is one selected from the group consisting of a circuit board, an insulated board, and a metal board.

12. The chip carrier structure of claim 7, wherein the circuit build up structure comprises at least one dielectric layer, at least one circuit layer formed on the dielectric layer and the conductive via formed in the dielectric layer.

* * * * *